(12) United States Patent
Daito

(10) Patent No.: US 7,583,217 B2
(45) Date of Patent: Sep. 1, 2009

(54) SWITCHED CAPACITOR TYPE D/A CONVERTER, AND DRIVE CIRCUIT FOR LIQUID CRYSTAL DISPLAY

(75) Inventor: Mutsuo Daito, Dako (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 12/016,503

(22) Filed: Jan. 18, 2008

(65) Prior Publication Data
US 2008/0174463 A1    Jul. 24, 2008

(30) Foreign Application Priority Data
Jan. 22, 2007    (JP)    ............................. 2007-11485

(51) Int. Cl.
*H03M 1/66*    (2006.01)
(52) U.S. Cl. .......................... 341/150; 341/144; 345/87
(58) Field of Classification Search ................. 341/144, 341/150
See application file for complete search history.

(56) References Cited

U.S. PATENT DOCUMENTS

| | | | |
|---|---|---|---|
| 5,818,377 A * | 10/1998 | Wieser | ........................ 341/144 |
| 6,169,509 B1 | 1/2001 | Abe | |
| 6,323,798 B1 * | 11/2001 | Abe | ........................... 341/150 |
| 6,693,574 B2 * | 2/2004 | Yamamura | ................... 341/150 |
| 7,057,544 B2 * | 6/2006 | Lilamwala | ................... 341/150 |

FOREIGN PATENT DOCUMENTS

| | | | |
|---|---|---|---|
| JP | 11-298329 A | 10/1999 | |
| JP | 2000-13234 A | 1/2000 | |

* cited by examiner

*Primary Examiner*—Khai M Nguyen
(74) *Attorney, Agent, or Firm*—Birch, Stewart, Kolasch & Birch, LLP

(57) ABSTRACT

A D/A converter of switched capacitor type capable of shortening the time for D/A conversion process without increasing power consumption is provided. The D/A converter comprises capacitors Cx and Cy for receiving input voltage corresponding to the digital data and charging the amount of charge corresponding to the input voltage, and an operational amplifier A21 including a first amplified output terminal To1 and a second amplified output terminal To2 for individually outputting amplified signals generated based on a signal inputted to the input terminal. During the conversion process, the amplified signal is outputted from the first amplified output terminal To1, after the conversion process is completed, the amplified signal is outputted through an output switch Sw6 from the first amplified output terminal To2.

8 Claims, 14 Drawing Sheets

SWITCHED CAPACITOR TYPE D/A CONVERTER, AND DRIVE CIRCUIT FOR LIQUID CRYSTAL DISPLAY

CROSS REFERENCE TO RELATED APPLICATION

This Nonprovisional application claims priority under 35 U.S.C. §119(a) on Patent Application No. 2007-011485 filed in Japan on 22 Jan., 2007 the entire contents of which are hereby incorporated by reference.

BACKGROUND OF THE INVENTION

1. Field of the Invention

The present invention relates to a D/A converter of switched capacitor type, and a drive circuit for a liquid crystal display.

2. Description of the Related Art

In recent years, with their characteristics of being flat and having low power consumption, liquid crystal display units have been used in the application of large-screen television as well as in such mobile applications as a mobile phone, a notebook personal computer, etc.

Methods of driving such liquid crystal display units are roughly divided into the following two methods: a simple matrix method and an active matrix method.

A simple matrix method is a mechanism wherein conductors are installed like a grid in two directions being orthogonal to each other, and liquid crystal material having anisotropic conductivity is injected into and formed at respective intersections so as to be sandwiched by conductors in the both directions, and liquid crystals at matrix intersections are driven by adjusting timing in a vertical or horizontal direction, respectively, and sending electric signals through the conductors, and quantity of light transmitted through a substrate from an external light source (back light) is adjusted, thus brightness of external pixels is adjusted. While the mechanism has a simple structure, is low in cost, and has a good yield, the simple matrix method suffers from the disadvantage that electrodes of respective liquid crystal cells constituting pixels are not independent, and voltage interferes, which affects cells in the periphery making it difficult to clearly display respective pixels and thus making it impossible to achieve a high contrast.

On the other hand, an active matrix method includes active elements (generally, TFT (Thin Film Transistor) is used) capable of switching control of respective pixels in addition to the structure of the simple matrix method, and individually drives liquid crystals located at respective intersections, by on-off controlling the active elements in a timely manner. According to this method, as respective pixels can be reliably lighted, a clear display screen with high responsivity is possible. Thus, currently, the active matrix method is widely used in computer displays, etc.

FIG. 11 is a block diagram showing schematically typical configuration of a liquid crystal display unit of an active matrix method. A liquid crystal display unit 1 shown in FIG. 11 includes a display control means 2, a data driver 3, a gate driver 4, and a liquid crystal display 5.

The liquid crystal display 5 has two substrates and a liquid crystal sandwiched by the both substrates, wherein a plurality of data lines DL extending in one direction are installed on one substrate, while a plurality of scan lines SL extending in a direction intersecting with the data lines DL are installed on the other substrate. Each data line DL and each scan line SL are configured to be able to be driven and controlled by the data driver 3 and the gate driver 4, respectively. Then, operations of the data driver 3 and the gate driver 4 are controlled by the display control means 2.

At intersection positions of respective data lines DL and respective scan lines SL, pixel circuits 6 are formed like a matrix. As shown in FIG. 11, the pixel circuit 6 includes a TFT 7, a liquid crystal display element 8, a reference terminal 9, and charging capacitor 10. Gate electrodes of the TFTs 7 provided in a plurality of the pixel circuits 6 that are arranged in the same row are connected to a common scan line SL, and driving and controlling of the scan line SL provides on-off control of the TFT 7. Source or drain electrodes of the TFTs 7 provided in the plurality of pixel circuits 6 arranged on the same column are also connected to a common data line. This enables TFT 7 provided in the pixel circuit 6 to become conduction state by driving the data line DL and the scan line SL connected to a target pixel circuit 6, and a voltage potential difference between the reference terminal 9 (such configured that predetermined voltage is applied (or grounded)) and the data line DL is applied to both ends of the charging capacitor 10 of the target pixel circuit 6, and thus charging is performed. Then, voltage at both ends of the charging capacitor 10 controls transmissivity of a liquid crystal display element 8, and thus the pixel control is performed.

FIG. 12 is a block diagram showing schematically typical configuration of the data driver as shown in FIG. 11. The data driver includes a shift register 11, a data register 12, a data latch 13, a level shifter 14, a group of D/A converters 15, and a gray-scale voltage generation circuit 16.

The shift register 11 outputs a shift pulse depending on a dock signal to be inputted. Depending on the shift pulse, the data register 12 sequentially shifts up a video signal inputted from the display control means 2, and distributes the video signal according to the number of outputs. The data latch 13 latches the video signal distributed by the data register 12, and simultaneously outputs all outputs to the level shifter 14, depending on a control signal to be inputted. The level shifter 14 converts voltage swing of the video signal to be inputted into magnitude of the voltage swing corresponding to liquid crystal driving voltage, and outputs the video signal to the group of D/A converters.

The group of the D/A converters 15 includes a plurality of D/A converters, each converter performing D/A conversion based on corresponding digital data to be inputted from the level shifter 14 and outputting to the data line DL through an output terminal 3$u$. Driving a target data line DL according to the timing of outputting gray-scale signals from this output terminal 3$u$ results in application of gray-scale voltage based on the video signals to the respective pixels connected to the data line DL to be driven, thus providing control corresponding to the gray-scale voltage.

As a D/A converter included in the above-described data driver 3, a D/A converter of switched capacitor type has been used conventionally (see Japanese Unexamined Patent Application No. 2000-13234, for instance).

FIG. 13 is a circuit diagram illustrating schematic configuration of the D/A converter of switched capacitor type having the conventional configuration described in Japanese Unexamined Patent Application No. 2000-13234 (hereinafter abbreviated to a "D/A converter", as appropriate). The D/A converter 101 as shown in FIG. 13 includes input capacitors C0, C1, . . . Cn having a capacitance ratio corresponding to the number of bits in input digital data (n being the same number as the number of bits in the input digital data) and an output capacitor Cc to be connected to output. The D/A converter 101 further includes an operational amplifier A91 that has a configuration in which the line to which the input capacitor and the output capacitor are connected in parallel shall be inverting input and the line from the reference voltage Vr shall be non-inverting input, switches S1 to Sn that switch connection of level voltages (V1, V2) with the input capacitor depending on the input digital data, and switches Sa1 to Sa5 that switch operation of the D/A converter.

Specifically, as shown in FIG. 13, the switches Sa2 to Sa5 are switches that can be on-off controlled, respectively, while the switches S1 to Sn and the switch Sa1 are switches capable of switching control of connections with H and L, respectively. The switches S1 to Sn are such configured that the level voltage V1 is applied thereto by being connected to the terminal H, and the level voltage V2 is applied thereto by being connected to the terminal L. In addition, the switch Sa1 is configured to be connected with the non-inverting input terminal of the operational amplifier A91 by being connected to the terminal H, and the switch Sa1 is connected with the amplified output terminal of the operational amplifier A91 by being connected to the terminal L.

In order to avoid complexity due to the increasing number of symbols, in the following, the symbols assigned to the respective capacitors shall directly designate a capacitance value of the capacitor, and describe the capacitor symbols and capacitor's capacitance values by same symbols so as not to be confused.

Herein, the input capacitors C0 to Cn shall have the capacitance value satisfying $Ci=Cu \cdot 2^{(i-1)}$ ($i=1,\ldots,n$) when n bits of digital data is inputted where the unit capacitance value is Cu. In addition, $C0=Cu$.

With this configuration, the switch Sa1 shall be H, Sa2 and Sa4 shall be off, Sa3 and Sa5 shall be on, and S1 to Sn shall be L during reset process. Then, point A in FIG. 13 (node of the inverting input terminal of the operational amplifier A91) is given voltage corresponding to Vr+Vos (Vos being offset voltage of the operational amplifier A91). Thus, a total value Q0 of charge amount to be charged to the respective input capacitor and the output capacitor can be expressed in the following formula 1:

$$Q0 = (Vr + Vos - Vr)C0 + \ldots + (Vr + Vos - Vr)Cn + \quad (1)$$
$$(Vr + Vos - Vr)Cc$$
$$= Vos \cdot Cu\left(2^n + \frac{Cc}{Cu}\right)$$

Then, during input of digital data, the switch Sa1 shall be L, Sa4 shall be on, Sa2, Sa3 and Sa5 shall be off, and S1 to Sn shall be either H or L depending on the digital data Md to be inputted. For instance, when n=8 and the digital data Md is "11100110", the switches S2, S3, S5, S6 and S7 shall be H, while the switches S1, S3, S4 shall be L. Then, a total value Q1 of the charge amount to be charged to the respective input capacitor and the output capacitor can be expressed in the following formula 2. However, Mt in the formula 2 shall be a value to be obtained by converting the digital data Md into a decimal number (Mt=230, in the above example). In addition, Vo' shall be voltage (voltage of an amplified signal) of the amplified output terminal of the operational amplifier A91.

$$Q1 = (Vr + Vos - V1)Mt \cdot Cu + (Vr + Vos - V2)(2^n - Mt)Cu + \quad (2)$$
$$(Vr + Vos - Vo')Cc$$

-continued
$$= (V2 - V1)Mt \cdot Cu + \left(2^n + \frac{Cc}{Cu}\right)Vr \cdot Cu +$$
$$\left(2^n + \frac{Cc}{Cu}\right)Vos \cdot Cu - 2^n V2 \cdot Cu - \frac{Cc}{Cu}Vo' \cdot Cu$$

Herein, as charges are stored between during the reset process and during the input of digital data, Q0=Q1 is true, and solving this allows Vo' to be obtained in the following formula 3:

$$Vo' = Vr - Mt \cdot V1 \cdot \frac{Cu}{Cc} - (2^n - Mt) \cdot V2 \cdot \frac{Cu}{Cc} \quad (3)$$

In fact, with the above operation, the voltage V0' to be outputted from the output terminal of the operational amplifier A91 shows the value based on the data Mt to be obtained by canceling offset voltage Vos of the operational amplifier A91 and converting the input digital data Md into the decimal number. After this, by turning on the output switch Sa2, output voltage Vout (=Vo') of magnitude based on the data Mt can be obtained. This may configure the D/A converter of switched capacitor type cap able of canceling offset of an operational amplifier.

In the case of the circuit configuration as described in FIG. 13, the output switch Sa2 in off state is connected to the output side of the operational amplifier A91 during reset process. The output switch Sa2 is designed to control whether or not to apply output voltage to be outputted from the D/A converter to the respective data lines DL for controlling display of liquid crystal element. As described above, the liquid crystal display 5 has a configuration in which the potential difference between the data line DL and the reference terminal 9 generates a voltage at the both ends of the charging capacitor 10 under the state where pixels are being selected, thereby the charging capacitor 10 is charged, and the voltage at the both ends of the charging capacitor 10 allows display of the liquid crystal element 8 to be controlled. Therefore, in order to implement liquid crystal control rapidly, charging should be rapidly performed to the charging capacitor 10. Thus, it is required to increase the size of the output switch Sa2 for applying output voltage for carrying out the charging to the data line DL.

However, when the size of the output switch Sa2 is increased, parasitic capacitance Ca2 (see FIG. 14) residing in the switch Sa2 is also increased. In addition to the input capacitors C0 to Cn and the output capacitor Cc, the parasitic capacitance Ca2 is also charged. However, there is the problem that due to increased size of the parasitic capacity Ca2, time to complete the charging operation will increase when amount of the current flowing in the circuit is same. In addition, when the amount of the current flowing in the circuit is increased in order to shorten the time of the charging operation, there also arises a new problem that power consumption in the D/A converter increase.

SUMMARY OF THE INVENTION

In view of the above problems, it is an object of the present invention to provide a D/A converter of switched capacitor type that can shorten time needed for D/A conversion without increasing power consumption. It is yet another object of the present invention to provide a drive circuit of a liquid crystal display including such a D/A converter of switched capacitor type.

In order to attain the above objects, a D/A converter of switched capacitor type according to the present invention is characterized as a first characteristic by comprising a capacitor that is given input voltage corresponding to digital data to be converted, and charges the amount of charge corresponding to the input voltage, and an operational amplifier including an input terminal receiving converted voltage based on the amount of charge charged into the capacitor, and an output terminal for outputting an amplified signal generated based on a signal inputted to the input terminal, wherein the operational amplifier comprises first and second amplified output terminals each of which can be controlled independently.

According to the first characteristic of the D/A converter of switched capacitor type according to the present invention, the D/A converter of switched capacitor type includes two terminals of the first and second amplified output terminals for outputting amplified signals to be generated by the operational amplifier, and can independently set whether or not to output the amplified signal from the respective terminals. In other words, the first amplified output terminal can be used as an output terminal for using amplified signals from the operational amplifier when D/A conversion is executed, and the second amplified output terminal can be used as an output terminal for outputting amplified signals after completing conversion to the analog output terminal. Thus, when an external device utilizes analog signals to be outputted from the analog output terminal after being subjected to the D/A conversion, no charging to parasitic capacitance that the output switch has during performing D/A conversion process, because the output switch has not been connected to the D/A conversion process path even if an output switch is provided for making a decision of whether or not to output the analog signals to the external device. This enables shortening of time needed for the process of charging charge to any capacitor that contributes to the D/A conversion process, without increasing amount of the current while considering the time necessary for charging to the parasitic capacitance.

For instance, according to one aspect of the above configuration, the D/A converter of switched capacitor type of the present invention can have the configuration in which two voltages, namely, the converted voltage based on the amount of charge stored in the capacitor and reference voltage are inputted to the operational amplifier, an amplified signal to be outputted from the first amplified output terminal is connected to a connection node of the capacitor and the input terminal of the operational amplifier through a switch capable of controlling conduction, and the amplified signal to be outputted from the second amplified output terminal is outputted to the external through an output switch.

In addition, the D/A converter of switched capacitor type according to the present invention has a second characteristic that in addition to the first characteristic configuration, the operational amplifier comprises a first switching transistor for controlling whether or not to output the amplified signal from the first amplified output terminal, and a second switching transistor for controlling whether or not to output the amplified signal from the second amplified output terminal.

According to the second characteristic configuration of the D/A converter of switched capacitor type according to the present invention, shortening of the time for the D/A conversion process can be implemented by adding a conventional known transistor circuit, thus an increase in the production cost can be suppressed as much as possible.

In addition to the first and second characteristic configuration, the D/A converter of switched capacitor type of the present invention also has a third characteristic that the operational amplifier outputs the amplified signal from the first amplified output terminal after a conversion process for the digital data is started until all of the input voltage corresponding to the digital data is applied to the capacitor, and outputs the amplified signal from the second amplified output terminal after application of all of the input voltage corresponding to the digital data has been completed.

In addition to the third characteristic, the D/A converter of switched capacitor type according to the present invention has the fourth characteristic that the capacitor comprises an input capacitor and a holding capacitor, and the operational amplifier executes the conversion process including a data input process for sequentially inputting voltages corresponding to the digital data into the input capacitor and charging the amount of charge corresponding to values of the inputted voltages, and a data holding process for holding, in the holding capacitor, the amount of charge corresponding to the amount of charge charged into the input capacitor until all of the voltages corresponding to the digital data has been inputted into the input capacitor, so that the converted voltage is generated based on the amount of charge charged into the holding capacitor after all of the voltages corresponding to the digital data has been inputted.

According to the fourth characteristic configuration, as the D/A converter of switched capacitor type of the present invention is such configured that the input voltage corresponding to digital data is sequentially inputted, and this input voltage is subjected to a sequential conversion process, capacity of each capacitor can be reduced compared with configuration that performs batch conversion. Thus, by introducing the configuration that charging of charge to parasitic capacitance of the output switch is not performed during D/A conversion process, the time necessary for the process of charging charge into the capacitor (input capacitor or holding capacitor) can be further reduced.

Additionally, the D/A converter of switched capacitor type according to the present invention has the fifth characteristic that the capacitor comprises an output capacitor capable of switching whether one terminal is connected to an input terminal of the operational amplifier or the second amplified output terminal, and a plurality of input capacitors corresponding to the number of bits to be converted, each of the input capacitors has capacitance corresponding to each bit, and the operational amplifier executes the conversion process including a reset process for charging predetermined charge into the output capacitor and each of the input capacitors, respectively, by applying predetermined voltages to both ends of each of the input capacitors, under the state that the output capacitor is connected to the input terminal of the operational amplifiers, and a data input process for charging the charge corresponding to the digital data into each of the input capacitors by inputting the voltage corresponding to each bit of the digital data into one terminal of each of the input capacitors, after the reset process.

According to the fifth characteristic configuration of the D/A converter of switched capacitor type according to the present invention, as charging of charge into parasitic capacitance of the output switch is not performed during the process of charging charge into each input capacitor by outputting an amplified signal from the amplified output terminal during the reset process, the time necessary for reset process is shortened, thus enabling reduction of the time necessary for the D/A conversion process.

In addition to any one of the third to fifth characteristic configurations, the D/A converter of switched capacitor type according to the present invention has the sixth characteristic that the operational amplifier comprises a plurality of the second amplified output terminals capable of outputting the amplified signals independently and an analog output terminal for each of the second amplified output terminals for outputting the amplified signal outputted from each of the second amplified output terminals to external, and after the conversion process is completed, the operational amplifier selects one of the second amplified output terminals depending on a target to be converted and outputs the amplified signal corresponding to the digital data from the selected second amplified output terminal.

According to the sixth characteristic configuration of the D/A conversion of switched capacitor type according to the present invention, an output destination to which an amplified signal after the conversion process is outputted from the analog output terminal can be changed by selecting and controlling the second amplified output terminal to which the amplified signal generated by the operational amplifier is outputted. Thus, the conversion process of the digital data can be implemented continuously and efficiently, because provision of a plurality of converters having this configuration with different output destinations enables the other D/A converter to execute the conversion process, while executing the process of outputting the amplified signals after the conversion process from the analog output terminal on one D/A converter.

The drive circuit of the liquid crystal display according to the present invention has the first characteristic that the drive circuit of the liquid crystal display comprises a plurality of the D/A converters of switched capacitor type including any one of the third to fifth characteristic configurations for each column or each line, respectively, for controlling corresponding pixels based on the size of electric signals outputted from the analog output terminal of the D/A converter of switched capacitor type, wherein the drive circuit alternately switches control for the plurality of the D/A converters of switched capacitor type for carrying out driving control over a same column or line so that one of the D/A converters of switched capacitor type outputs the amplified signal from the second amplified output terminal, while the other D/A converters of switched capacitor type execute the conversion process.

According to the first characteristic configuration of the drive circuit of the liquid crystal display according to the present invention, time necessary for driving control of the liquid crystal display can be shortened, because the drive circuit is configured to drive the liquid crystal display by using the D/A converter of switched capacitor type (hereinafter simply abbreviated to as the "D/A converter") according to the present invention that is designed to shorten the time for the D/A conversion process. Additionally, while one D/A converter is outputting an analog signal for driving to the liquid crystal display, the drive circuit can cause the other D/A converters to execute the D/A conversion process based on the digital data (i.e., voltage generation process for driving the liquid crystal display).

In addition to the first characteristic configuration, the drive circuit of the liquid crystal display according to the present invention has the second characteristic that the amplified signal outputted from each of the second amplified output terminals of the plurality of the D/A converters of switched capacitor type provided for each column or line is inputted, through the analog output terminal in common, into a pixel area to be controlled by the D/A converter of switched capacitor type in an array of pixels on the column or line, an output destination changeover switch for switching an output destination of the amplified signal to be outputted is connected to the analog output terminal, and the output destination changeover switch is controllably switched, thereby the amplified signal is to be outputted from the second amplified output terminal of the D/A converter of switched capacity type controlled so as to be able to output the amplified signal from the second amplified output terminal, among the plurality of the D/A converters of switched capacitor type provided in the same column or line, to a target to be controlled by the D/A converter of switched capacitor type.

A plurality of the D/A converters according to the present invention that the drive circuit of the liquid crystal display according to the present invention is provided with is configured to be capable of individually controlling whether or not to output an amplified signal from the second amplified output terminal. Thus, even though output destinations to which each converter outputs amplified signals after being converted, i.e., pixel areas to be driven and controlled, are different, it is possible to share the output line to be connected to the second amplified output terminal of the both converters, thus being able to share the output switch (output destination control switch), by controlling so that no amplified signal is outputted simultaneously from the second amplified output terminals of both converters, and switching and controlling by the output destination control switch so that the amplified signal to be outputted from the second amplified output terminal will be outputted to the target pixel areas which is an output destination of the converter. In other words, when compared with the configuration including the output switch corresponding to each converter, the number of output switches can be reduced. Usually, as the size of the output switch is large when driving and controlling a liquid crystal display, the area to be occupied by the drive circuits can be cut down by reducing the number of the output switches.

In addition, the drive circuit of the liquid crystal display according to the present invention is characterized as the third characteristic by comprising the plurality of D/A converters of switched capacitor type including the sixth characteristic configuration for each column or each line, for controlling corresponding pixels based on the size of electric signals outputted from an analog output terminal of the D/A converter of switched capacitor type, wherein the plurality of the DA converters of switched capacitor type provided for each column or line control different pixel areas in a pixel array on the column or line, respectively, a plurality of the analog output terminals each of which is provided for each pixel area to be controlled are individually connected with the plurality of the second amplified output terminals of the D/A converter of switched capacitor type, and are also individually connected with the second amplified output terminals of the other D/A converters of switched capacitor type provided for each column or line, the D/A converter of switched capacitor type in which the conversion process is completed controls the operational amplifier and enables the amplified signal to be outputted from the predetermined second amplified output terminal, and thereby outputs the amplified signal to the pixel area to be controlled through the analog output terminal connected to the second amplified output terminal.

According to the third characteristic configuration of the drive circuit of the liquid crystal display according to the present invention, since the D/A converter according to the present invention is configured to include a plurality of second amplified output terminals, the second amplified output terminal can be connected to every output destination, even if output destinations to which the D/A converters output the amplified signals after being converted, i.e., the pixel areas to be driven and controlled are different. With this configuration, each second amplified output terminals corresponding to a same output destination of each D/A converter can be connected to the common output line, and the output destinations of the amplified signal can be changed by selecting the second amplified output terminal for outputting the amplified signal in the D/A converter (operational amplifier), thereby eliminating the need for providing for the output destination changeover control switch for switching output destinations. This can further reduce area dedicated to the drive circuit of the liquid crystal display.

The configuration of the D/A converter of switched capacitor type according to the present invention enables shortening the time for D/A conversion process without increasing power consumption. In addition, the configuration of the drive circuit of the liquid crystal display according to the present invention enables shortening of the time for driving and control of the liquid crystal display.

DETAILED DESCRIPTION OF THE INVENTION

In the following, referring to respective drawings, embodiments of a D/A converter of switched capacitor type (hereinafter referred to a "converter of the present invention", as appropriate), and a drive circuit of a liquid crystal display (hereinafter referred to as a "drive circuit of the present invention, as appropriate) will be described. The drawings to be described below and the content to be described later are intended to describe preferred embodiments of the present invention, and not representative of a sole aspect that can embody the present invention.

Figure 11:
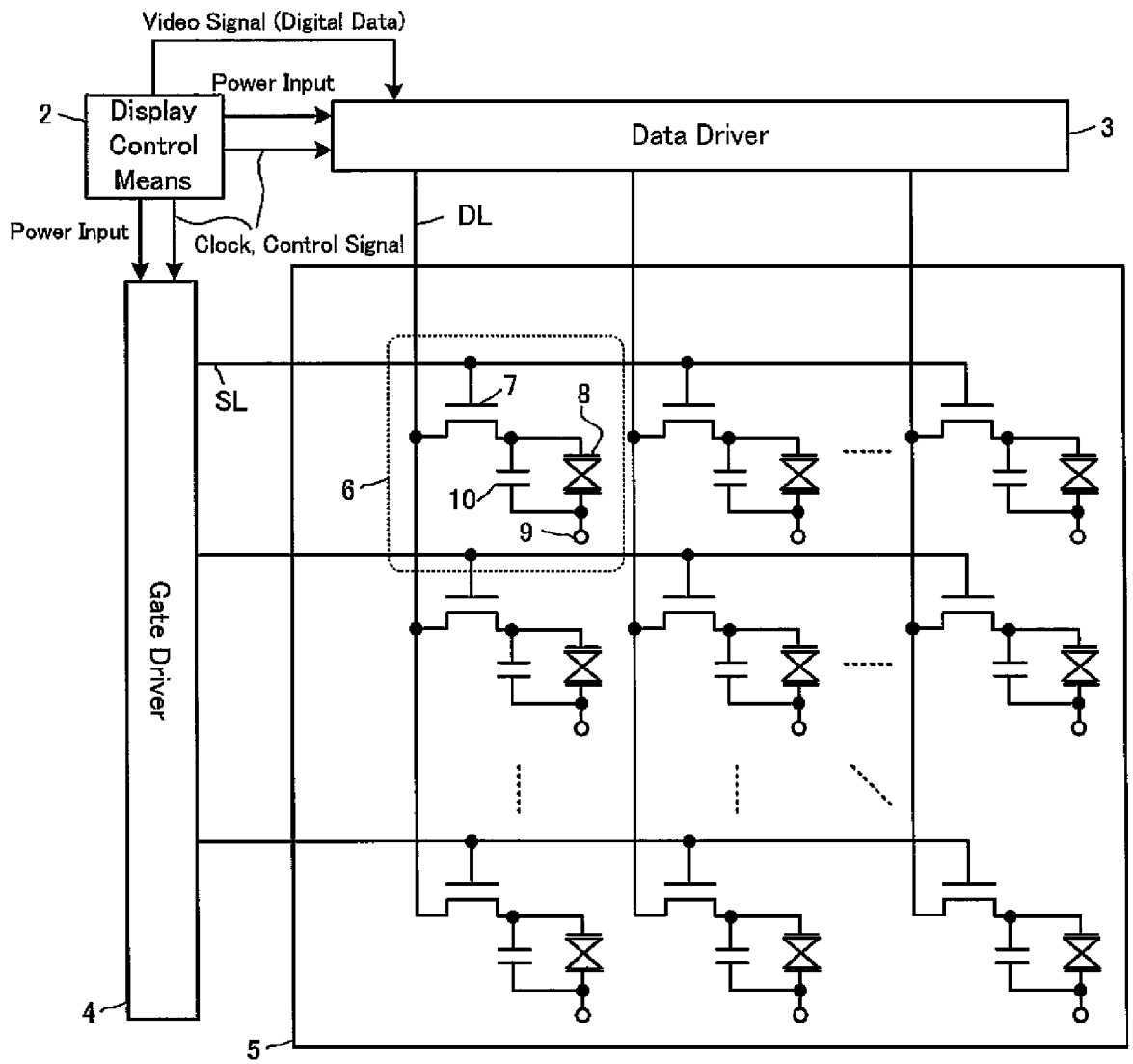
FIG. 11 is a block diagram showing schematic configuration of a liquid crystal display unit of an active matrix method.
Figure 12:
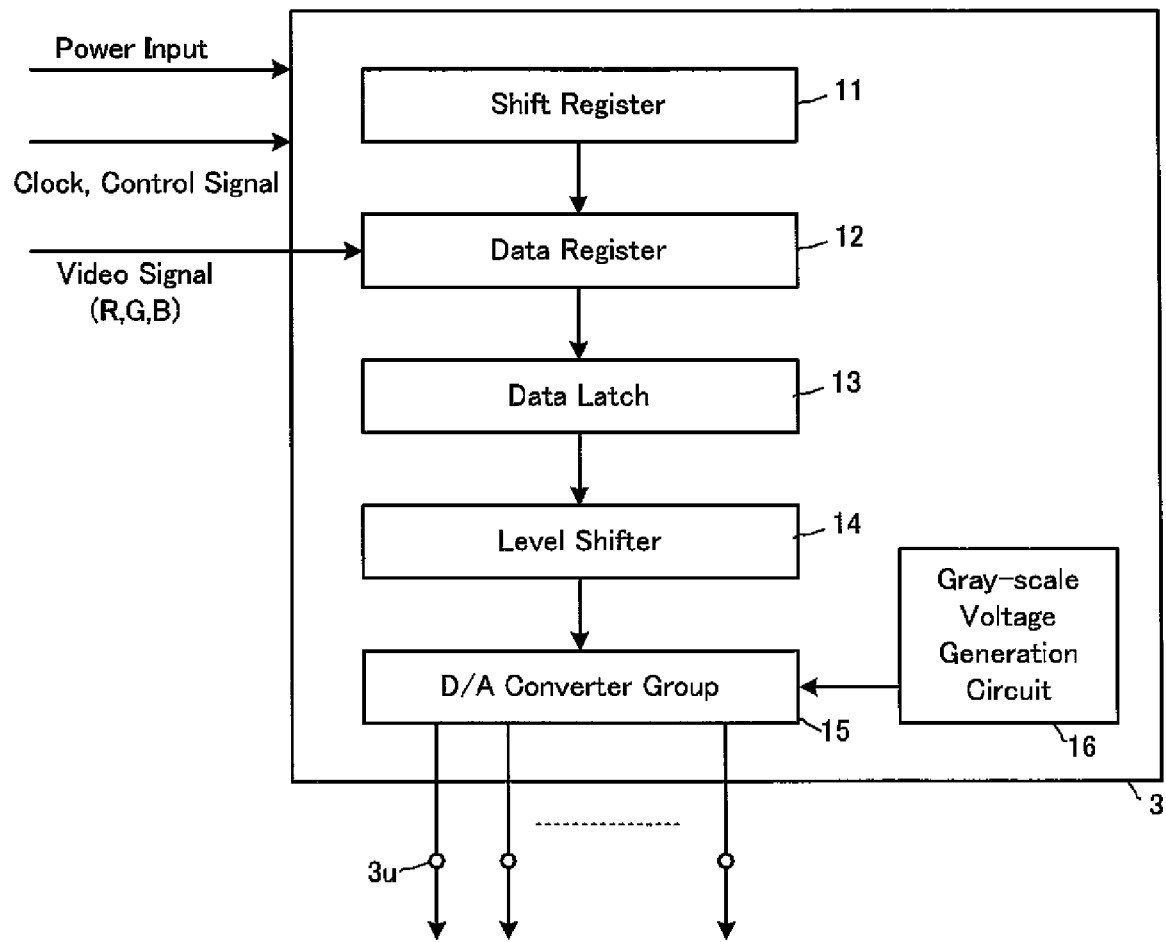
FIG. 12 is a block diagram showing schematic configuration of a data driver.

In addition, the drive circuit of the present invention is the data driver 3 included in a liquid crystal display unit 1, as shown in FIG. 11, and is characterized in that voltage control of each pixel circuit 6 is performed by output voltage to be generated by using the converter of the prevent invention to be described later.

First Embodiment of the Converter of the Present Invention

In the following, a first embodiment of the converter of the present invention (hereinafter referred to as "this embodiment" as appropriate) with reference to FIG. 1 to FIG. 4 will be described. Any components that are identical to those in the conventional configuration shown in FIG. 11 to FIG. 14 are assigned same symbols to simplify or omit the description. In addition, in respective embodiments to be described later as wells as in this embodiment, in order to avoid complexity resulting from an increasing number of symbols, the symbols assigned to respective capacitors shall directly represent values of capacitance of the capacitor, and thus the symbols of the capacitors and capacitance values of the capacitors are described with the same symbols so as not be confused.

Figure 1:
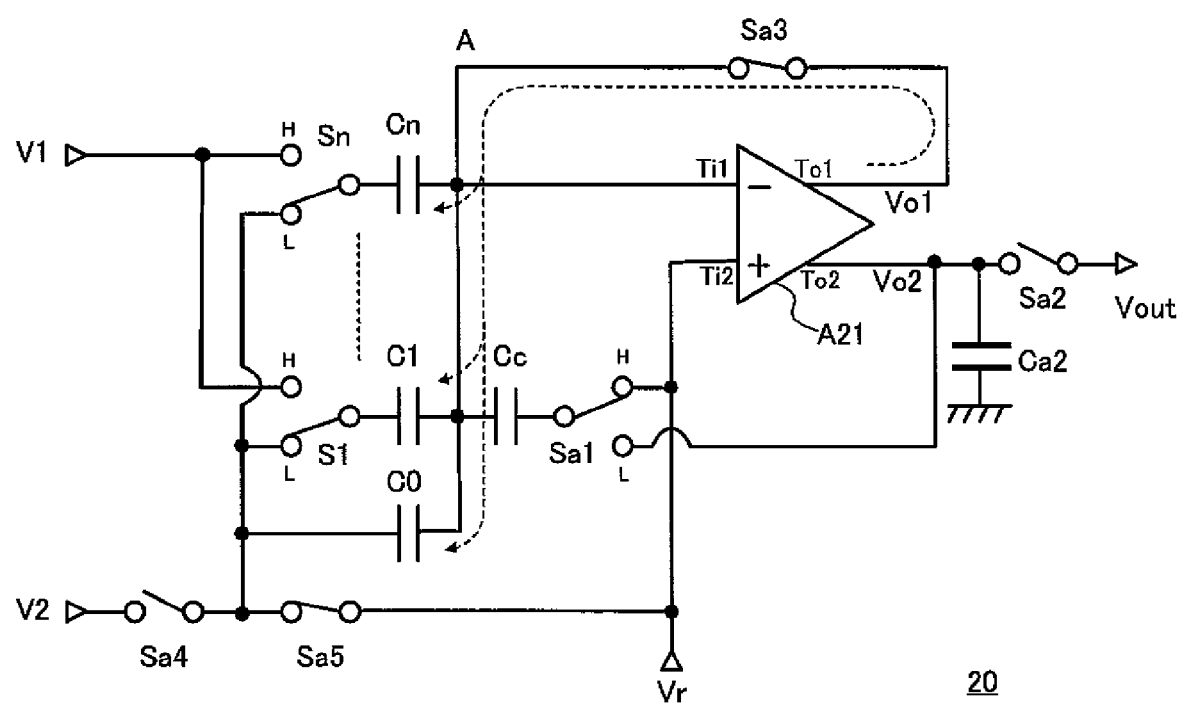
FIG. 1 is a circuit diagram (during the reset process) showing schematic configuration of a first embodiment of the D/A converter of switched capacitor type according to the present invention.
Figure 2:
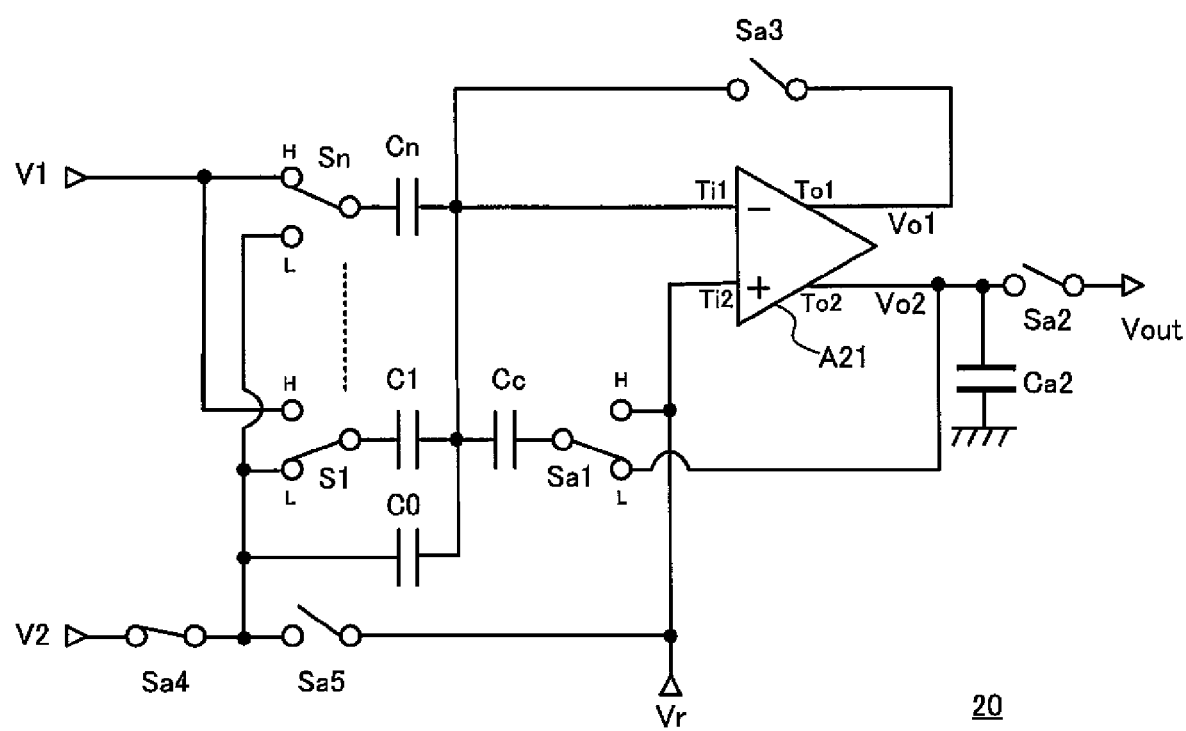
FIG. 2 is a circuit diagram (during the data input process) showing schematic configuration of the first embodiment of the D/A converter of switched capacitor type according to the present invention.
Figure 13:
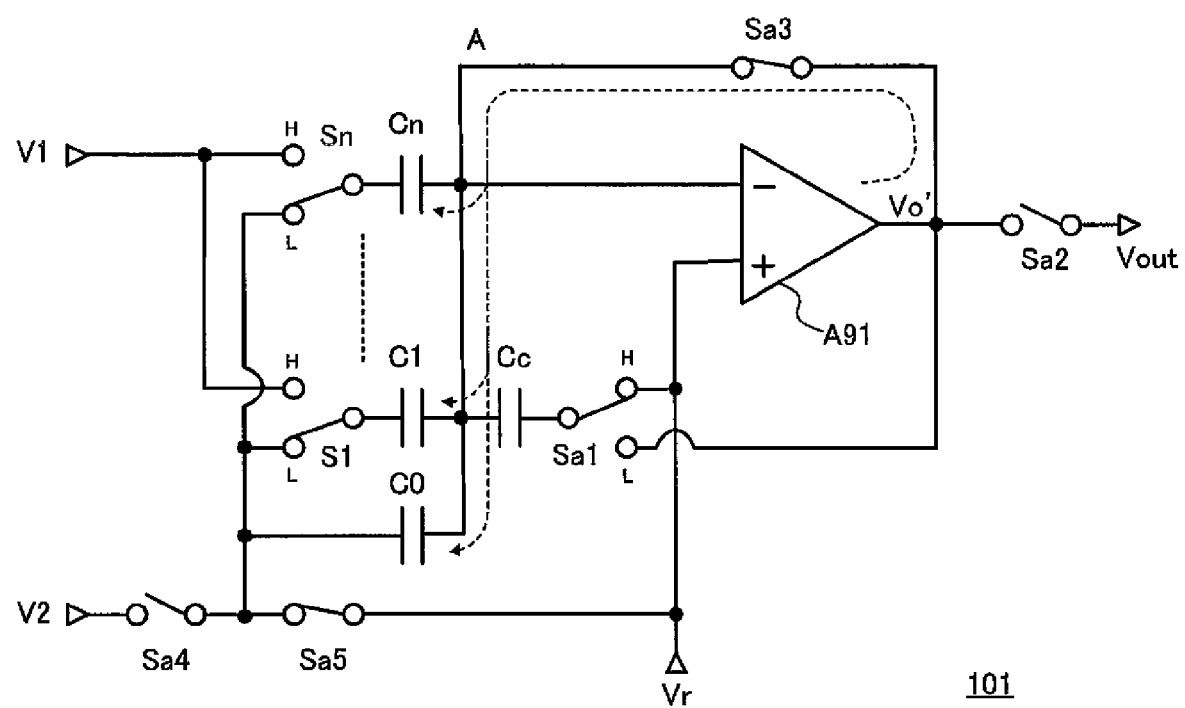
FIG. 13 is a circuit diagram showing schematic configuration of the D/A converter of switched capacitor type having conventional configuration.
Figure 14:
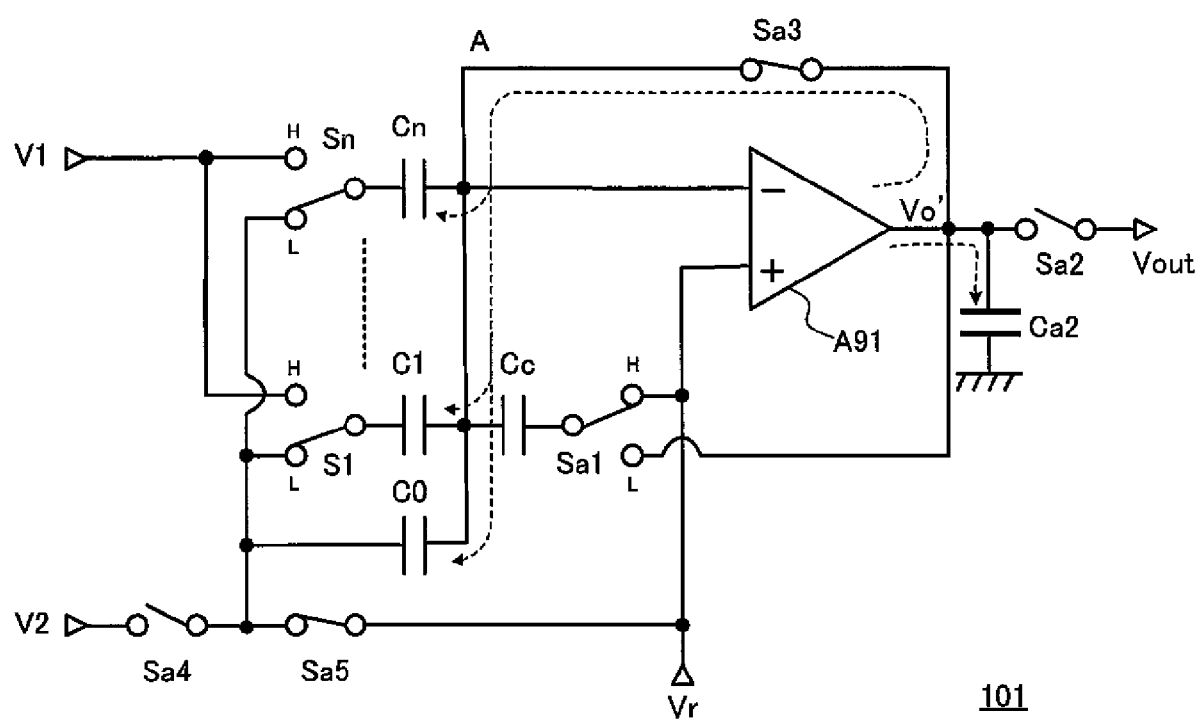
FIG. 14 is a circuit diagram (considering parasitic capacitance of the output switches) showing schematic configuration of the D/A converter of switched capacitor type having conventional configuration.

FIG. 1 is a circuit diagram showing schematic configuration of the converter of the present invention in this embodiment. Compared with a D/A converter 101 of conventional configuration as shown in FIG. 13, the converter of the present invention 20 shown in FIG. 1 is only different in the configuration of an operational amplifier, but the other configuration is common thereto. In addition, similar to FIG. 14, FIG. 1 also shows parasitic capacitance Ca2 of an output switch Sa2.

The operational amplifier A21 included in the converter 20 of the present invention is configured to include a plurality of output terminals (To1, To2), and to generate amplified signals by providing amplification to a voltage difference of signals to be inputted into inverting input terminal (first input terminal) Ti1 and non-inverting input terminal (second input terminal) Ti2 based on the predetermined amplification factor, and be capable of independently outputting the amplified signals from the first amplified output terminal To1 and the second amplified output terminal To2, respectively.

The first input terminal Ti1 of the operational amplifier A21 is connected to one terminal of input capacitors C0, C1, . . . , Cn and an output capacitor Cc, and to the first amplified output terminal To1 through amplifier feedback control switch Sa3. Other terminal of the respective input capacitors are such configured that voltage corresponding input digital data (V1, V2) or reference voltage for resetting can be applied through switches S1 to Sn and Sa5. In addition, the other terminal of the output capacitor Cc is such configured to be able to be connected with any of a second input terminal Ti2 or a second output terminal To2 through the switch Sa1. Other configurations are common to the conventional configuration as shown in FIG. 13.

In the following, procedures of the D/A conversion process of the converter 20 of the present invention that has been configured as described above will be described.

First, before entering digital data to be converted into each input capacitor, reset process is executed on the converter 20 of the present invention. FIG. 1 shows status of respective switches (S1 to Sn, and Sa1 to Sa5) during execution of the reset process). In fact, when the reset process is executed, the switch Sa1 shall be H, Sa2 and Sa4 shall be off, Sa3 and Sa5 shall be on, and S1 to Sn shall be L. Then, the operational amplifier A21 is configured to be able to output amplified signals only from the first amplified output terminal To1, and not from the second amplified output terminal To2. In addition, in the following, amplified signals from the first amplified output terminal To1 shall be referred to as "amplified signal Vo1" and amplified signals from the second amplified output terminal To2 shall be referred to as "amplified signal Vo2", as appropriate.

With this configuration, offset voltage Vos of the operational amplifier 21 is applied to terminals of the respective input capacitors C0 to Cn and output capacitor Cc connected to point A in FIG. 1 and predetermined amount of charge is charged into each capacitor. Then, as the first amplified output terminal To1 that outputs the amplified signal Vo1 is not connected with the switch Sa2, charge is not charged into parasitic capacitance C2.

Next, the switch Sa4 shall be on, Sa3 and Sa5 shall be off, and the switch Sa1 shall be L. The digital data input process is executed by selecting the switches S1 to Sn to be H or L, respectively, depending on the digital data Md to be converted (See FIG. 2) under the state where the amplified signal Vo2 can be outputted from the second amplified terminal To2 of the operational amplifier A21. Then, setting may be such that no amplified signal is outputted from the first amplified output terminal To1.

With this configuration, the amount of charge to be charged for the input capacitors C0 to Cn shall be a value corresponding to the digital data Md, and voltage Vo2 corresponding to the voltage of the connecting node for these input capacitors and output capacitor Cc is outputted from the second amplifier output terminal To2. Since the voltage Vo2 corresponds to Vo' in the mathematical expression 3 described above, the voltage Vo2 shows a value based on data (analog converted value) Mt to be obtained by converting the digital data Md into a decimal number. In fact, by turning on the output switch Sa2 under this state, the voltage Vout based on the converted value Mt that was obtained by analog converting the digital data Md is outputted from the converter 20 of the present invention, and D/A conversion is thereby performed.

Figure 3:
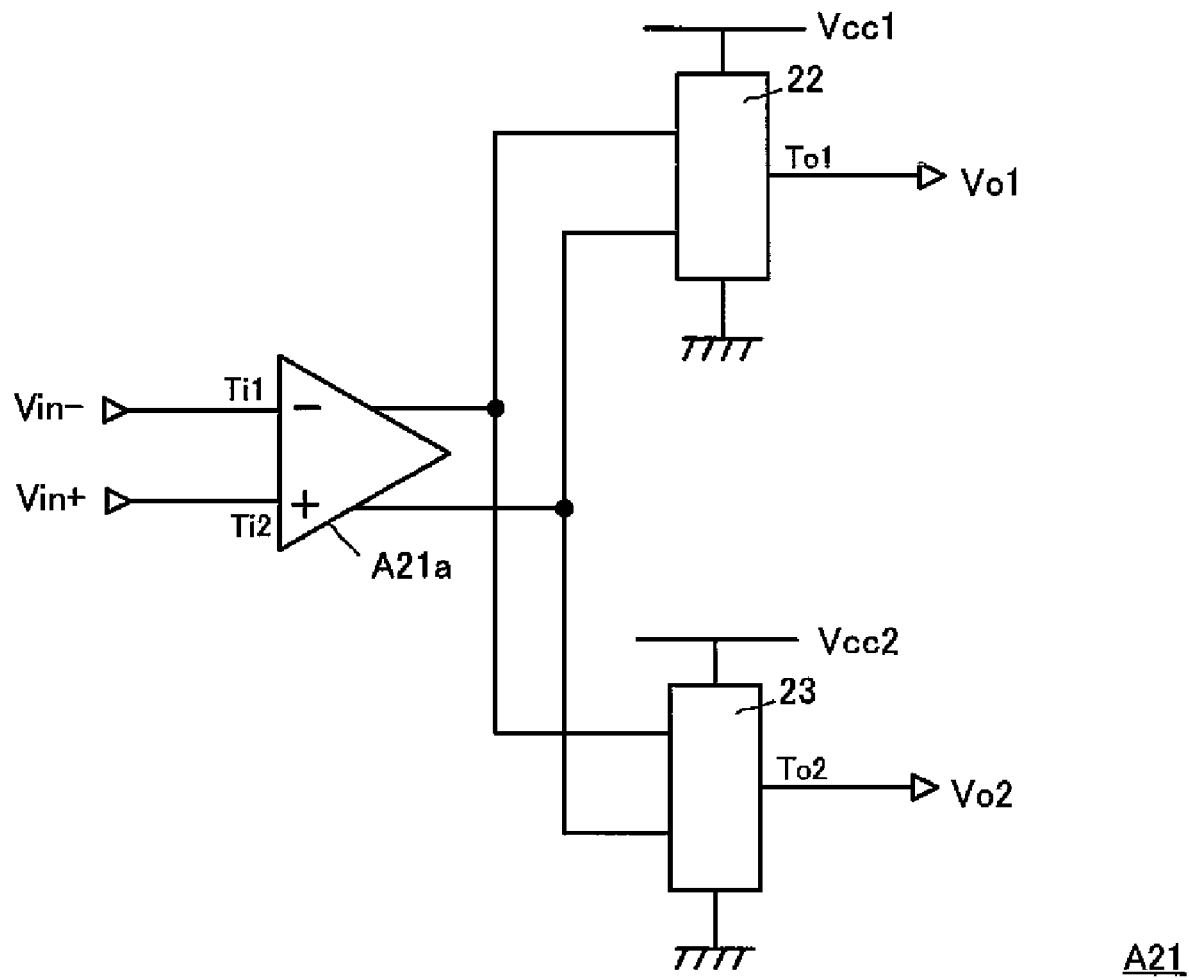
FIG. 3 is a block diagram showing schematic configuration of an operational amplifier included in the D/A converter of switched capacitor type according to the present invention.

FIG. 3 is a circuit block diagram showing schematic configuration of the operational amplifier A21. As shown in FIG. 3, the operational amplifier A21 includes an operational amplifier A21a that amplifies and outputs a voltage difference of two signals to be inputted, a first output means 22 that amplifies the amplified signal to be outputted from the operational amplifier A21a and controls whether or not to output from the first amplified output terminal To1, and a second output means 23 that amplifies the amplified signal to be outputted from the operational amplifier A21a and controls whether or not to output from the second amplified output terminal To2. The both output means 22 and 23 can independently control output without depending on content of control of other output means.

Figure 4:
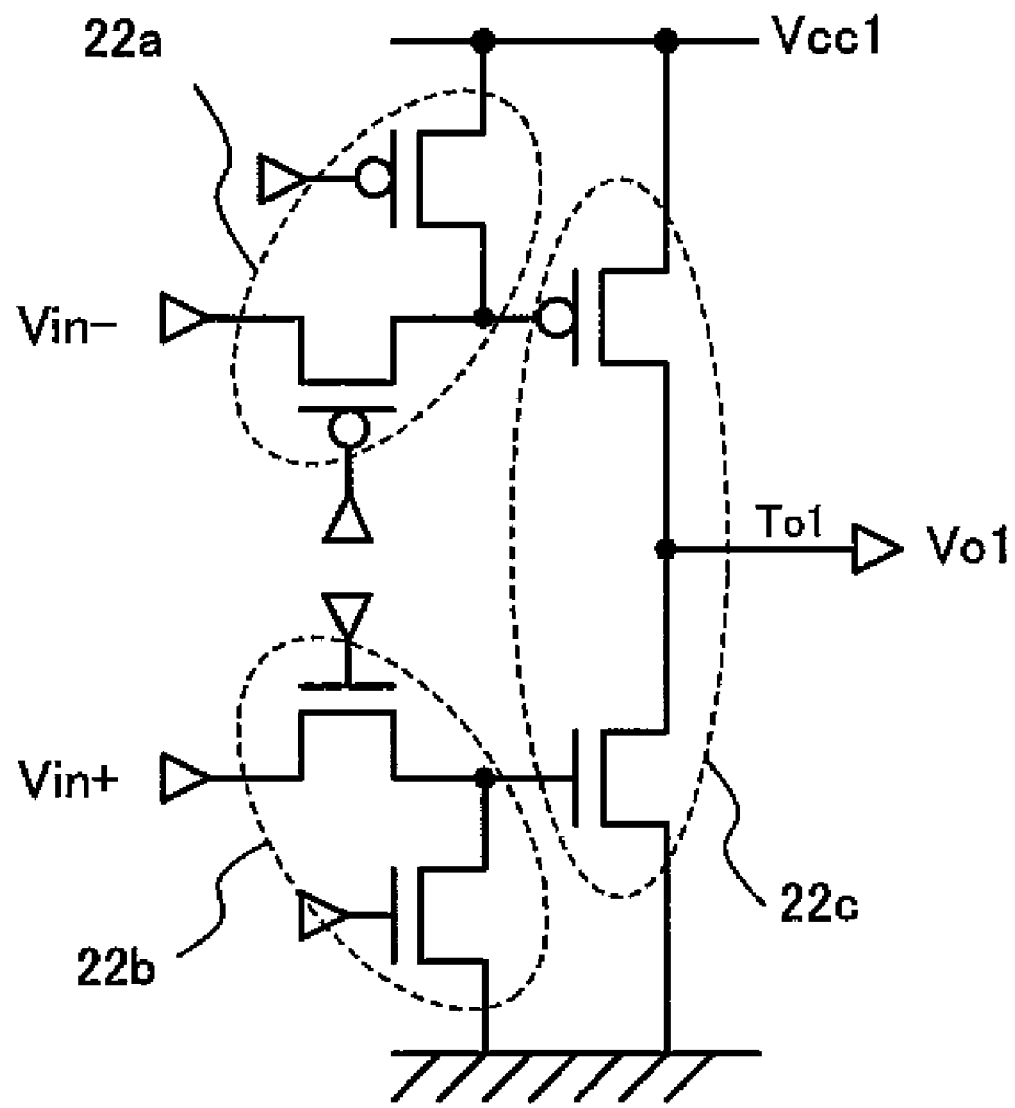
FIG. 4 is an example of a circuit diagram showing schematic configuration of a first amplified output control means.

FIG. 4 is one example of a circuit diagram showing schematic configuration of the first output means 22. The first output means 22 as shown in FIG. 4 includes a first switching transistors 22a and 22b for determining whether or not to output amplified signals to be given from the operational amplifier A21a, and an output transistor 22c for amplifying a signal to be outputted through the first switching transistor and outputting the amplified signal from the first amplified output terminal To1. The first switching transistors 22a and 22b being controlled, it is determined whether or not to output the amplified signal of the operational amplifier A21a from the first amplified output terminal To1. Although it is not shown, a second output means 23 may also have the configuration similar to the first output means 22. In fact, the second output means 23 may includes the transistor (the second switching transistor) that is to be given the amplified signal from the operational amplifier A21a, and the output transistor that amplifies the amplified signals to be outputted from the second switching transistor, and outputs the amplified signals from the second amplified output terminal To2.

According to the configuration of the present embodiment, by having the first switching transistor in conduction state and having the second switching transistor in non-conduction state while the converter 20 of the present invention is executing the reset process, no charging to the parasitic capacitance Ca2 included in the output switch Sa2 is performed because the output switch Sa2 and the first amplified output terminal To1 are not connected when predetermined amount of charge is charged to the input capacitors C0 to Cn and the output capacitor Cc. Thus, unlike the conventional configuration, the configuration of this embodiment is free from the problem that as charging to the parasitic capacitance Ca2 is performed, the time for the reset process will increase. In fact, as there is no need of increasing the amount of the current flowing in the circuit to shorten the time for the reset process, the time for the reset process can be shortened while suppressing the increase in power consumption, thereby being able to reduce the time for executing D/A conversion process.

Second Embodiment of the Present Invention

In the following, a second embodiment of the converter of the present invention (hereinafter referred to as "this embodiment" as appropriate) with reference to FIG. 5 to FIG. 8 will be described. Any components identical to those in the first embodiment will be assigned same symbols to simplify or omit the description thereof.

Figure 5:
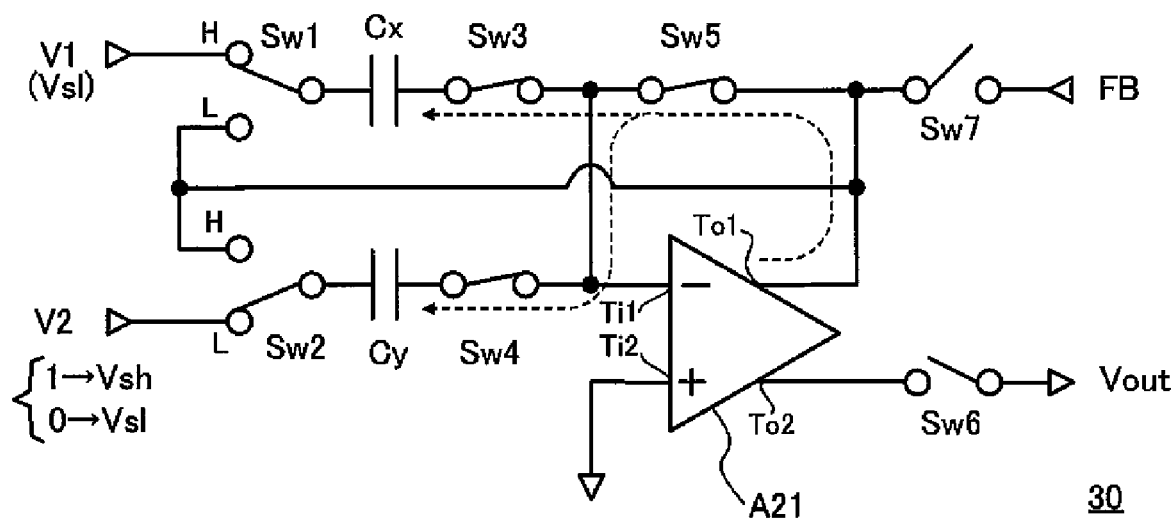
FIG. 5 is a circuit diagram (during initial data input) showing schematic configuration of a second embodiment of the D/A converter of switched capacitor type according to the present invention.

FIG. 5 is a circuit diagram showing schematic configuration of the converter of the present invention in this embodiment. The converter 30 of the present invention as shown in FIG. 5 includes input switches Sw1 to Sw4, an input capacitor Cy, a holding capacitor Cx, an operational amplifier A21, an amplifier feedback control switch Sw5, an output switch Sw6 and an output feedback control switch Sw7. In addition, the operational amplifier A21 is common to the first embodiment and configured to be capable of independently outputting amplified signals from the first output terminal To1 and the second output terminal To2, respectively. Similar to the output switch Sa2 in the first embodiment, the output switch Sw6 in this embodiment is configured by a large-sized switch, and thus has sufficiently large parasitic capacitance Cw6.

The first input terminal Ti1 of the operational amplifier A21 is connected to one terminal of the holding capacitor Cx through the switch Sw3 and to one terminal of the input capacitor Cy through the switch Sw4, respectively. The other terminal of the holding capacitor Cx is connected with the switch Sw1 that can switch connection between H and L, and is configured to be connected with the first output terminal To1 of the operational amplifier A21 through the switch Sw1 in state L, and voltage V1 is applied through the switch Sw1 in state H. In addition, the other terminal of the input capacitor Cy is connected with the switch Sw2 that can switch connection between H and L and is configured to be connected with the first output terminal To1 of the operational amplifier 21A through the switch Sw2 in state H, and voltage V2 is applied through the switch Sw2 in state L. In addition, the second input terminal Ti2 of the operational amplifier A21 is connected to the reference voltage.

The first output terminal To1 of the operational amplifier A21 is connected with the terminal L of the switch Sw1 and the terminal H of the switch Sw2, and connected with the first input terminal Ti1 through the amplifier feedback control switch Sw5. The first output terminal To1 of the operational amplifier A21 is also connected with output signals from the liquid crystal display through the output feedback control switch Sw7. In addition, similar to the first embodiment, the second output terminal To2 of the operational amplifier A21 is connected with the data line DL through the output switch Sw6.

With such configuration, first, as shown in FIG. 5, the switch Sw1 shall be H, the switch Sw2 shall be L, the switches Sw3, Sw4, and the amplifier feedback control switch Sw5 shall be on, and the output feedback control switch Sw7 shall be off. In addition, the operational amplifier A21 is configured to be capable of outputting amplified signals only from the first amplified output terminal To1, and not from the second amplified output terminal To2. Then, voltage V2 shall be set to any of first reference voltage Vsh, and second reference voltage Vs1, depending on the digital data Md. Specifically, when each bit value of the digital data Md is "1", the first reference voltage Vsh is inputted into the terminal L of the switch Sw2, while if each bit value of the digital data Md is "0", the second reference voltage Vs1 is inputted as voltage V2 into the terminal L of the switch Sw2. Herein, assuming that the second reference voltage Vs1=0 and the bit value of the digital data Md is b for simplicity, description of V2=b·Vsh (where b=0 or 1) is possible. In addition, voltage V1 shall be the same voltage as the second reference voltage Vs1.

The converter 30 of the present invention in this embodiment is configured to sequentially input data for every bit from the Least Significant Bit (LSB) to the most significant bit of the digital data Md to be converted. For instance, when the LSB value is b0, voltage V2=b0·Vsh is applied to one terminal of the input capacitor Cy, according to the above description. Then, since the offset voltage Vos of the operational amplifier A21 is applied to the other terminal of the input capacitor Cy, charge Qy=(Vos−b0·Vsh) Cy is charged into the capacitor Cy. In addition, in the case of the holding capacitor Cx, since voltage Vs1 is applied to one terminal and voltage Vos to the other terminal, charge Qx=(Vos−Vs1) Cx is charged.

Figure 6:
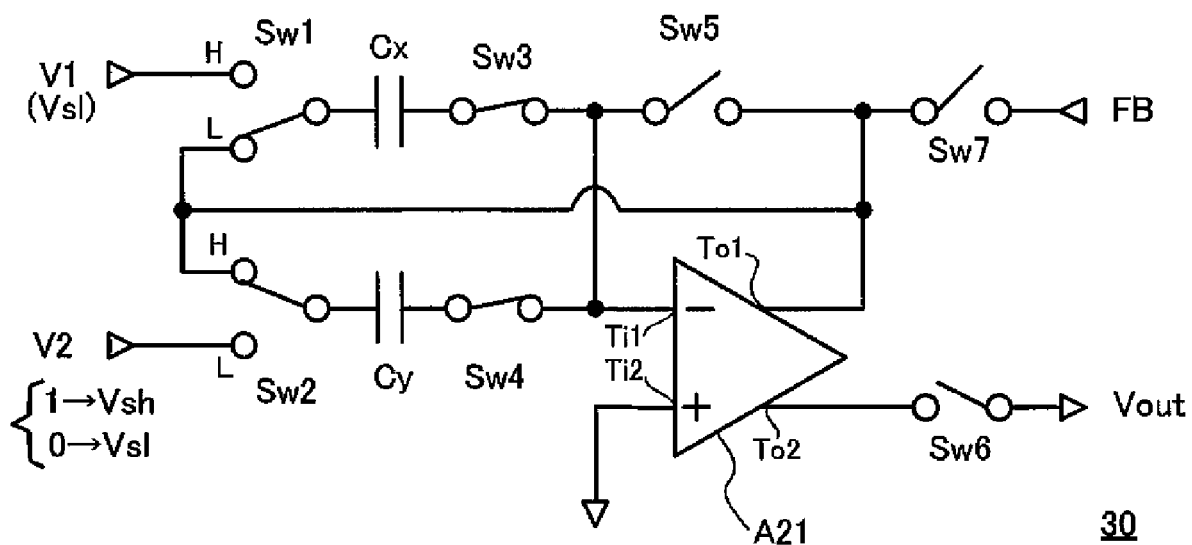
FIG. 6 is a circuit diagram (during data holding) showing schematic configuration of the second embodiment of the D/A converter of switched capacitor type according to the present invention.

When input of voltage V2 that corresponds to the LSB bit value b0 of the digital data Md is completed, the switch Sw1 shall be L, the switch Sw2 shall be H, and the switch Sw5 shall be off (see FIG. 6). With this configuration, the holding capacitor Cx and the input capacitor Cy are shorted through the switches Sw1 and Sw2 and through the switches Sw3 and Sw4, and the charge that was charged respectively will be distributed. Then, assuming that voltage in the connection node (point B in FIG. 6) to be connected to the terminal L of the switch Sw1 and the terminal H of the switch Sw2 is Vb, charge Qy'=(Vos−Vb) Cy is charged to the capacitor Cy and charge Qx=(Vos−Vb) Cx is charged to the capacitor Cx, respectively.

Herein, as Qx+Qy=Qx'+Qy' is true according to the charge conservation rule, the equality shown in the following mathematical expression 4 will be true.

$$(Vos-Vsl)Cx+(Vos-b0\cdot Vsh)Cy=(Vos-Vb)Cx+(Vos-Vb)Cy \quad (4)$$

Herein, for simplicity, if the mathematical expression 4 for Vb is solved by assuming that similar to the above, the second reference voltage Vs1=0, the following mathematical expression 5 can be obtained:

$$Vb = \frac{b0 \cdot Cy \cdot Vsh}{Cx + Cy} \quad (5)$$

Herein, assuming that the capacitance of the both capacitors is equal (Cx=Cy), Vb=b0·Vsh/2 can be derived. In fact, the offset voltage Vo of the operational amplifier A21 can be canceled, and a voltage value Vb based on the LSB value b0 of the digital data Md can be obtained.

Figure 7:
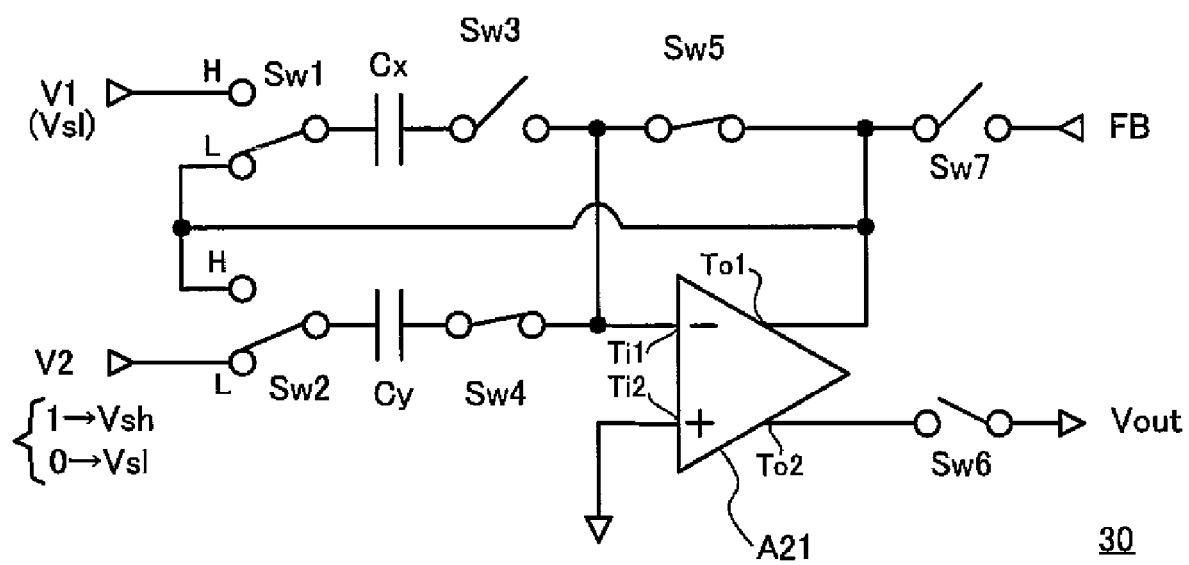
FIG. 7 is a circuit diagram (during data input process) showing schematic configuration of the second embodiment of the D/A converter of switched capacitor type according to the present invention.

Then, the switch Sw1 shall be L, the switch Sw2 shall be L, the switch Sw3 shall be off and the switch Sw5 shall be on (See FIG. 7). With this configuration, charge Qx1=(Vos−b0·Vsh/2) Cx is held in the holding capacitor Cx. Then, voltage V2=b1·Vsh corresponding to the bit value b1 of the second bit from LSB of the digital data Md is inputted into the input capacitor Cy. As a result of this, charge Qy1=(Vos−b1·Vsh) Cy is charged into the input capacitor Cy. Then, by repeating switching control as illustrated in FIG. 6 and FIG. 7, and by sequentially applying to the input capacitor Cy voltages corresponding to the bit values of the digital data Md up to the Most Significant Bit (MSB), the voltage Vb at point B in FIG. 6 and FIG. 7 can be expressed as in the following mathematical expression 6.

$$Vb = Vsh \sum_{i=0}^{i-1} \frac{bi}{2^{n-i}} \quad (6)$$

In fact, when input of data is all completed, amplified signals can be outputted from the second amplified output terminal To2, and by turning on the output switch Sw6, amplified signals to be outputted from the second amplified output terminal To2 is outputted as Vout onto the data line DL. At this time, the configuration should be such that no amplified signal is outputted from the first amplified output terminal To1.

With such configuration, similar to the first embodiment, while the process of charging charge into capacitors (in this embodiment, the process corresponds to both the data input process of applying voltage corresponding to a value for every bit, and the data holding process of charging into the data holding capacitor charge based on the applied voltage) is executed, amplified signals are outputted from the first amplified output terminal. As no charging into parasitic capacitance Cw6 of the output switch Sw6 is performed while charge is being charged into the input capacitor Cy and the holding capacitor Cx, the time necessary for charging charge into the input capacitor Cy and the holding capacitor Cx may be shortened. In addition, as this embodiment is such configured that data is sequentially inputted for every bit value, and sequential conversion process is performed on the input data, capacity of the capacitors can be smaller than the configuration of the first embodiment that performs batch conversion on all bit values. Accordingly, the greater effect of reducing the time can be achieved, compared with the configuration in which charging of charge into the parasitic capacitance of the output switch Sw6 is performed, and the configuration of the first embodiment.

Figure 8:
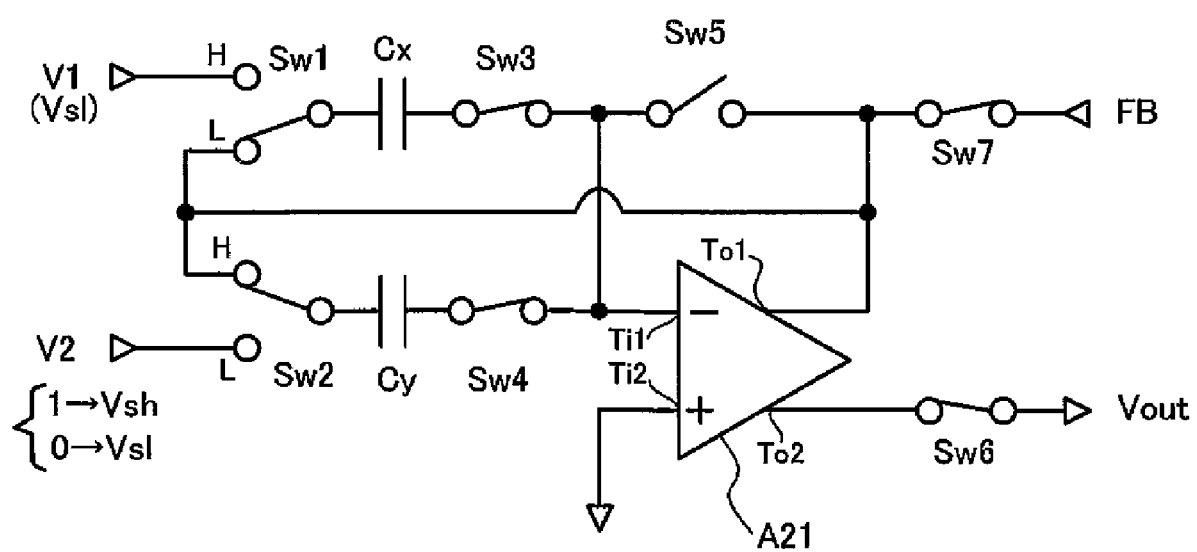
FIG. 8 is a circuit diagram (during data output process) showing schematic configuration of the second embodiment of the D/A converter of switched capacitor type according to the present invention.

In addition, when the output voltage Vout after being converted is outputted onto the data line DL from the switch Sw6, output of the liquid crystal monitor should be returned by turning on the output feedback control switch Sw7 (See FIG. 8).

Additionally, as the conversion capacity is smaller than the capacity of the liquid crystal display, by optimizing the current running through the first and second output means in the operational amplifier A21, working current can be reduced more compared with the case in which there is only one output means.

Third Embodiment of the Converter of the Present Invention

In the following, a third embodiment of the converter of the present invention (hereinafter referred to as "this embodiment" as appropriate) with reference to FIG. 9 and FIG. 10 will be described. Any components identical to those in the first and second embodiments will be assigned same symbols to simplify or omit the description thereof.

Figure 9:
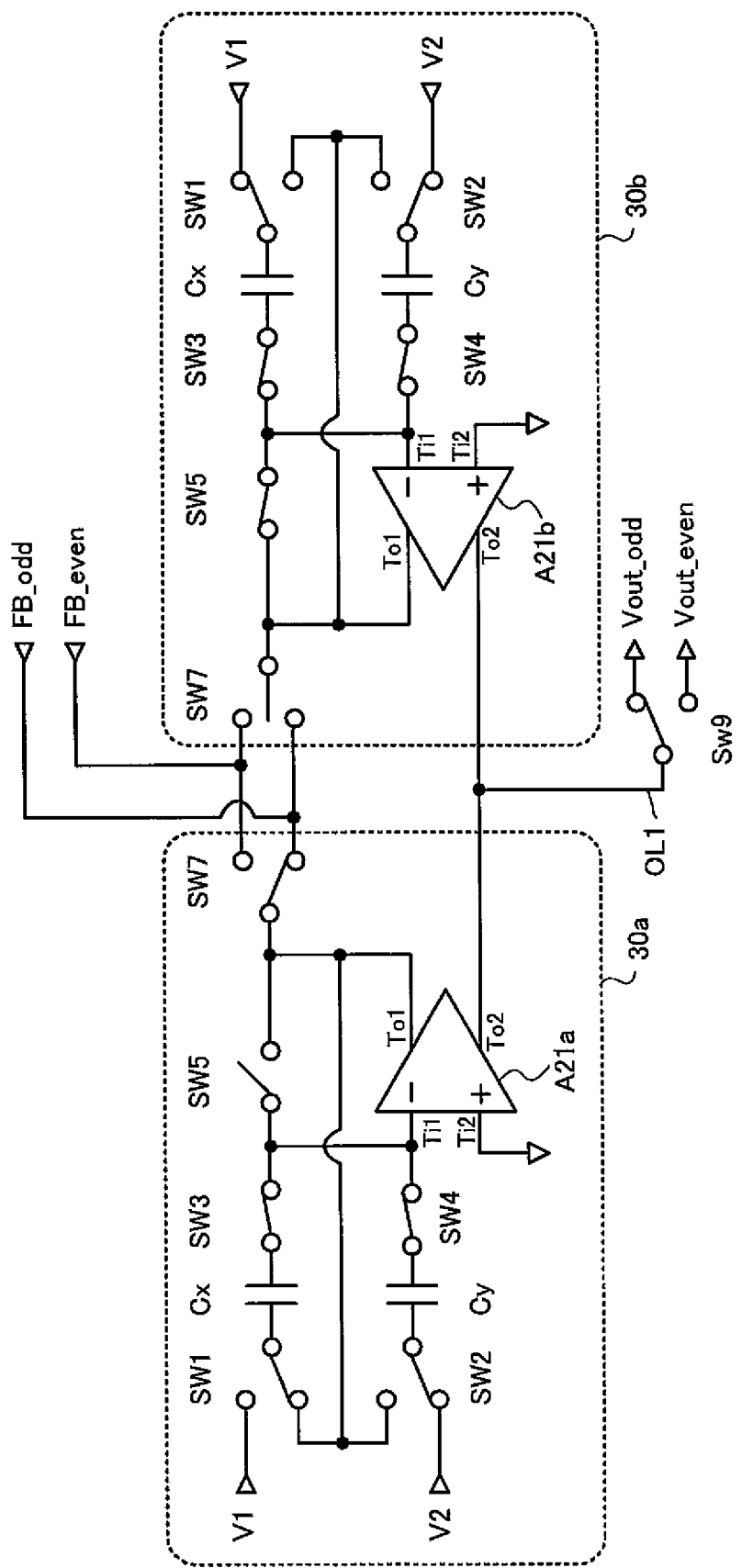
FIG. 9 is a circuit diagram showing schematic configuration of a third embodiment of the D/A converter of switched capacitor type according to the present invention.

FIG. 9 is a circuit diagram showing schematic configuration of the converter of the present invention in this embodiment. The converter 40 of the present invention as shown in FIG. 9 has the configuration including a plurality of converters that is identical to the converter 30 of the present invention in the second embodiment in which the switch Sw6 has been removed (FIG. 9 shows the configuration including two converters 30 of the present invention).

In other words, the converter 40 of the present invention includes two converters 30a, 30b of the present invention having the configuration identical to the configuration in which the switch Sw6 has been removed from the converter 30 of the present invention in the second embodiment, and is such configured that the second amplified output terminals of the both operational amplifiers A21a and A21b (corresponding to the operational amplifier 21A) are mutually connected to the common output line OL1, and thus amplified signals can be outputted through the output switch Sw9. The output switch Sw9 is configured to be capable of switching and controlling connections and referred to as "output destination changeover control switch Sw9", as appropriate, in the following.

As described earlier, the converter 30 of the present invention in the second embodiment is configured to output amplified signals from the first amplified output terminal To1 of the operational amplifier A21 while the process of charging charge into capacitors is executed. Then, after the conversion process on digital data to be converted is completed, amplified signals based on a value of the digital data is outputted from the second amplified output terminal To2. Then, while the amplified signals are outputted, the conversion process is not performed and amplified signals after being converted are not outputted to the external while the conversion process is executed.

The converter 40 of the present invention in this embodiment is such configured that by including a plurality of the converters 30a and 30b of the present invention, the D/A conversion processes are continuously performed because control is alternately switched by having one converter execute the output process, while having the other converter execute the conversion process.

For instance, assuming that the converter 30a of the present invention as shown in FIG. 9 controls voltages for pixel circuits connected to the data lines DL associated with odd columns, and that the converter 30b of the present invention is configured to control voltages for the pixel circuits connected to the data lines DL associated with even columns. FIG. 9 shows the switch connection state in which the converter 30a is performing the conversion process. In this case, the converter 30a of the present invention outputs amplified signals to predetermined target data lines arranged on the odd columns through the output destination changeover control switch Sw9, while the converter 30b of the present invention executes D/A conversion process for controlling voltages associated with predetermined target data lines arranged on the even columns. The output destination changeover switch Sw9 changes a destination of a connection to any data line of the odd column or even column, depending on the converter 30 of the present invention that is now processing output. Additionally, the output feedback control switch Sw7 also changes a destination of a connection depending on the converter 30 of the present invention that is now processing output.

With such configuration, as one converter outputs amplified signals after being converted while the other converter is executing D/A conversion process, the D/A conversion process can be executed continuously and efficiently. Then, the converter of the present invention includes the first amplified output terminal for outputting amplified signals when executing the conversion process and the second amplified output terminal for outputting the amplified signal after being converted, wherein no amplified signal is outputted from the second amplified output terminal included in the converter of the present invention, which is now performing conversion. Therefore the output line for outputting amplified signals to the external can be shared by the both converters. In other words, thus the output destination changeover control switch Sw9 can be shared by the both converters.

In the case of the conventional configuration in which amplified signals are outputted to the output switch during the conversion process, each converter should be provided with the output switch, and thus the number of output switches should be increased in order to perform the D/A conversion process continuously and efficiently. However, as described earlier, as the output switch is large, increasing the number of output switches may lead to expansion of occupied area and thus is not preferable. On the other hand, the configuration of this embodiment enables the D/A conversion process to be performed continuously and efficiently, without increasing the number of the output switches.

Additionally, when a liquid crystal display is driven and controlled, generally, it is necessary to alternately drive with voltages above and below intermediate voltage. Thus, two converters 30 of the present invention can also be used in the control over pixel circuits connected to the data lines on the same column. In fact, if converters are to be divided by odd and even columns of the data lines described above, the configuration may be such that four converters of the present invention are used in controlling the liquid crystal displays.

Figure 10:
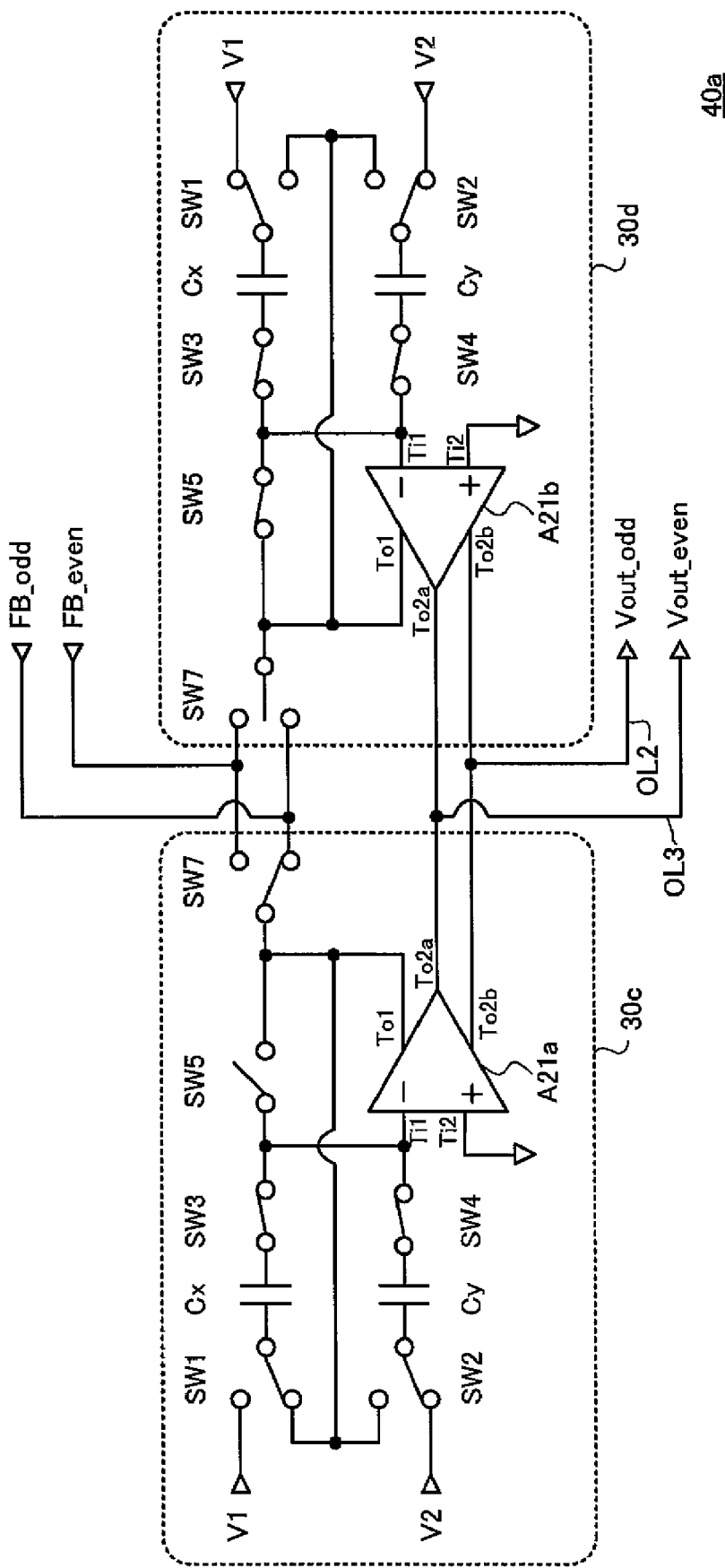
FIG. 10 is another circuit diagram showing schematic configuration of the third embodiment of the D/A converter of switched capacitor type according to the present invention.

FIG. 10 is another example of the configuration in this embodiment. Similar to the converter 40 of the present invention as shown in FIG. 9, the converter 40a of the present invention as shown in FIG. 10 also includes two converters 30c, 30d of the present invention. However, unlike the configuration of FIG. 9, the operational amplifiers A21c and A21d, included in the respective converters 30c, 30d respectively include a plurality of second amplified output terminals To2a, To2b (in the configuration of FIG. 10, the number of the second amplified output terminals is two). Like the configuration of FIG. 3, the respective second amplified output terminals To2a, To2b are configured to be capable of independently controlling output of amplified signals, respectively. Then, the second amplified output terminals To2a of the both converters are connected to the shared output line OL2 and thus configured to be capable of outputting amplified signals to the data lines associated with odd columns, while the second amplified output terminals To2b of the both converters are connected to the shared output line OL3 and thus configured to be capable of outputting amplified signals to the data lines associated with even columns. FIG. 10 also shows the switch connection condition in which the converter 30c of the present invention is processing output and the converter 30d of the present invention is processing conversion.

FIG. 10 is the configuration including two second amplified output terminals for outputting amplified signals to the external, each terminal being connected to the data lines of odd columns and even columns. Thus switching and controlling of output destinations can be performed within the operational amplifiers A21c and A21d without including the output switches for switching output destinations. Thus, the number of output switches can be reduced, which thereby implement both reduction of occupied area and efficient D/A conversion process.

Although the above configuration is such that each converter of the present invention includes two second amplified output terminals, the number of the second amplified output terminals is not limited to two, and the configuration may be such that more than three second amplified output terminals are provided.

In addition, in this embodiment, the case in which more than one converter of the present invention having the configuration of the second embodiment are provided is described, it is also possible to implement the configuration that has a plurality of converters of the present invention having the configuration of the first embodiment described above and that drives and controls the liquid crystal display by a method similar to this embodiment.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A D/A converter of switched capacitor type comprising:
   a capacitor that is given input voltage corresponding to digital data to be converted, and charges an amount of charge corresponding to the input voltage; and
   an operational amplifier including an input terminal receiving converted voltage based on the amount of charge charged into the capacitor, and an output terminal for outputting an amplified signal generated based on a signal inputted to the input terminal; wherein
   the operational amplifier comprises first and second amplified output terminals each of which can be controlled independently, wherein
   the operational amplifier comprises a first switching transistor for controlling whether or not to output the amplified signal from the first amplified output terminal, and a second switching transistor for controlling whether or not to output the amplified signal from the second amplified output terminal.

2. A D/A converter of switched capacitor type comprising:
   a capacitor that is given input voltage corresponding to digital data to be converted, and charges an amount of charge corresponding to the input voltage; and
   an operational amplifier including an input terminal receiving converted voltage based on the amount of charge charged into the capacitor, and an output terminal for outputting an amplified signal generated based on a signal inputted to the input terminal; wherein
   the operational amplifier comprises first and second amplified output terminals each of which can be controlled independently, wherein
   the operational amplifier outputs the amplified signal from the first amplified output terminal after a conversion process for the digital data is started until all of the input voltage corresponding to the digital data is applied to the capacitor, and outputs the amplified signal from the second amplified output terminal after application of all of the input voltage corresponding to the digital data has been completed.

3. The D/A converter of switched capacitor type according to claim 2, wherein
   the capacitor comprises an input capacitor and a holding capacitor, and
   the operational amplifier executes the conversion process including:
   a data input process for sequentially inputting voltages corresponding to the digital data into the input capacitor and charging the amount of charge corresponding to values of the inputted voltages; and
   a data holding process for holding, in the holding capacitor, an amount of charge corresponding to the amount of charge charged into the input capacitor until all of the voltages corresponding to the digital data has been inputted into the input capacitor, so that
   the converted voltage is generated based on the amount of charge charged into the holding capacitor after all of the voltages corresponding to the digital data has been inputted.

4. The D/A converter of switched capacitor type according to claim 2, wherein
   the capacitor comprises an output capacitor capable of switching whether one terminal is connected to an input terminal of the operational amplifier or the second amplified output terminal, and a plurality of input capacitors corresponding to the number of bits to be converted,
   each of the input capacitors has capacitance corresponding to each bit, and
   the operational amplifier executes the conversion process including:
   a reset process for charging predetermined charge into the output capacitor and each of the input capacitors, respectively, by applying predetermined voltage to both ends of each of the input capacitors, under a state that the output capacitor is connected to the input terminal of the operational amplifier; and
   a data input process for charging charge corresponding to the digital data into each of the input capacitors by inputting a voltage corresponding to each bit of the digital data into one terminal of each of the input capacitors, after the reset process.

5. The D/A converter of switched capacitor type according to claim 2, wherein
   the operational amplifier comprises a plurality of the second amplified output terminals capable of outputting the amplified signals independently and an analog output terminal for each of the second amplified output terminals for outputting the amplified signal outputted from each of the second amplified output terminals to external, and after the conversion process is completed, the operational amplifier selects one of the second amplified output terminals depending on a target to be converted and outputs the amplified signal corresponding to the digital data from the selected second amplified output terminal.

6. A drive circuit of the liquid crystal display comprising the plurality of D/A converters of switched capacitor type according to claim 5 for each column or line for controlling corresponding pixels based on size of electric signals outputted from an analog output terminal of the D/A converter of switched capacitor type, wherein the plurality of D/A converters of switched capacitor type provided for each column or line control different pixel areas in a pixel array on the column or line, respectively, a plurality of the analog output terminals each of which is provided for each pixel area to be controlled are individually connected with the plurality of the second amplified output terminals of the D/A converter of switched capacitor type, and are also individually connected with the second amplified output terminals of the other D/A converters of switched capacitor type provided for each column or line, and the D/A converter of switched capacitor type in which the conversion process is completed controls the operational amplifier and enables the amplified signal to be outputted from the predetermined second amplified output terminal, and thereby outputs the amplified signal to a pixel area to be controlled through the analog output terminal connected to the second amplified output terminal.

7. A drive circuit of a liquid crystal display comprising a plurality of the D/A converters of switched capacitor type according to claim 2 for each column or each line for controlling corresponding pixels based on size of electric signals outputted from the analog output terminal of the D/A converter of switched capacitor type, wherein the drive circuit alternately switches control for the plurality of the D/A converters of switched capacitor type for carrying out driving control over a same column or line so that one of the D/A converters of switched capacitor type outputs the amplified signal from the second amplified output terminal, while the other D/A converters of switched capacitor type execute the conversion process.

8. The drive circuit of the liquid crystal display according to claim 7, wherein the amplified signal outputted from each of the second amplified output terminals of the plurality of the D/A converters of switched capacitor type provided for each column or line is inputted, through the analog output terminal in common, into an pixel area to be controlled by the D/A converter of switched capacitor type in an array of pixels on the column or line, an output destination changeover switch for switching an output destination of the amplified signal to be outputted is connected to the analog output terminal, and the output destination changeover switch is controllably switched, thereby the amplified signal is to be outputted from the second amplified output terminal of the D/A converter of switched capacity type controlled so as to be able to output the amplified signal from the second amplified output terminal, among the plurality of the D/A converters of switched capacitor type provided in a same column or line, to a target to be controlled by the D/A converter of switched capacitor type.

* * * * *